(12) United States Patent
Abbott, Jr. et al.

(10) Patent No.: US 10,125,010 B2
(45) Date of Patent: Nov. 13, 2018

(54) ELASTIC DEVICE

(71) Applicant: HEWLETT-PACKARD DEVELOPMENT COMPANY, L.P., Houston, TX (US)

(72) Inventors: James Elmer Abbott, Jr., Albany, OR (US); Zhizhang Chen, Corvallis, OR (US); John L Williams, Philomath, OR (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 0 days.

(21) Appl. No.: 15/328,315

(22) PCT Filed: Jul. 30, 2014

(86) PCT No.: PCT/US2014/048979
§ 371 (c)(1),
(2) Date: Jan. 23, 2017

(87) PCT Pub. No.: WO2016/018324
PCT Pub. Date: Feb. 4, 2016

(65) Prior Publication Data
US 2017/0210616 A1    Jul. 27, 2017

(51) Int. Cl.
*B41J 2/14*  (2006.01)
*B81B 3/00*  (2006.01)
*B81B 7/00*  (2006.01)

(52) U.S. Cl.
CPC ............ *B81B 3/0075* (2013.01); *B41J 2/14* (2013.01); *B81B 7/0061* (2013.01); *B81B 2201/0242* (2013.01); *B81B 2203/01* (2013.01); *B81B 2203/0118* (2013.01); *B81B 2203/0127* (2013.01)

(58) Field of Classification Search
CPC ............ B81B 3/0075; B81B 7/0061; B81B 2201/0242; B81B 2203/01; B81B 2203/0127; B81B 2203/0118; B41J 2/14
See application file for complete search history.

(56) References Cited
U.S. PATENT DOCUMENTS 6,140,746 A    10/2000  Miyashita et al.
6,402,304 B1    6/2002  Qiu et al.
7,204,586 B2    4/2007  Hoisington et al.
(Continued)

OTHER PUBLICATIONS
Epson. Epson's Precision Core Printhead Technology.

*Primary Examiner* — Yaovi M Ameh
(74) *Attorney, Agent, or Firm* — HP Inc.—Patent Department

(57) ABSTRACT

An elastic device may comprise an amorphous metal comprising at least one refractory metal, at least two elements selected from periods, 4, 5, 6, 9, and 10, and at least one metalloid. A membrane may comprise a layer of silicon dioxide and a layer of amorphous metal. A MEMS device may comprise a layer of amorphous metal comprising at least one refractory metal, at least two elements selected from periods, 4, 5, 6, 9, and 10, and a metalloid. In one example, the amorphous material comprises Tantalum (Ta), Tungsten (W), and Silicon (Si). In another example, the metalloid is Silicon. In yet another example, the refractory metals comprise Niobium, Molybdenum, Tantalum, Tungsten, Rhenium, or combinations thereof.

20 Claims, 3 Drawing Sheets

(56) References Cited

U.S. PATENT DOCUMENTS

| | | |
|---|---|---|
| 7,240,409 B2 | 7/2007 | Sumi et al. |
| 7,984,977 B2 | 7/2011 | Takeda |
| 8,434,855 B2 | 5/2013 | Huffman et al. |
| 8,740,355 B2 | 6/2014 | Nawano et al. |
| 2006/0017533 A1 | 1/2006 | Jahnes et al. |
| 2006/0072187 A1* | 4/2006 | McKinnell ............ B81B 3/0072 359/321 |
| 2012/0328860 A1* | 12/2012 | Baugher ................ B81B 3/007 428/217 |
| 2013/0106961 A1 | 5/2013 | Van et al. |
| 2013/0250007 A1 | 9/2013 | Ishimori et al. |
| 2014/0065445 A1* | 3/2014 | Katano ................. G11B 5/725 428/833.3 |

* cited by examiner

ELASTIC DEVICE

BACKGROUND

Microelectromechanical systems (MEMS) are devices that are relatively small compared to other devices. These devices may sometimes be on the nano-scale size. In some MEMS, various elements may flex or bend. These flexure points may allow the MEMS device to perform their intended function.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
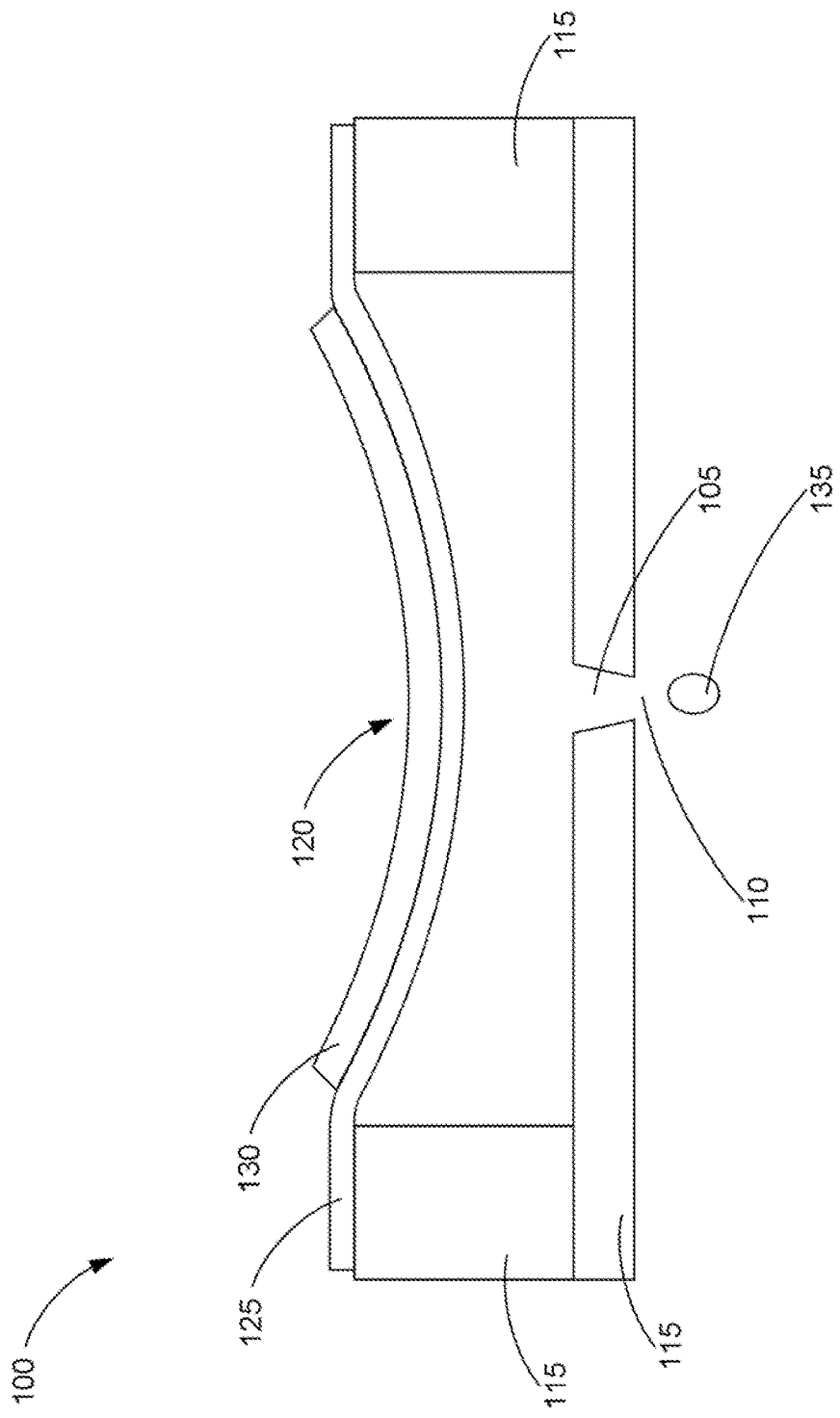
FIG. 1 is a diagram of a fluid chamber in a printhead according to one example of the principles described herein.

As described above, MEMS devices perform various functions on the scale of about 20 micrometers to a millimeter. The components of the MEMS may be between 1 to 100 micrometers in size. Some of these components may include springs, membranes, hinges or other similar elastic devices. The elasticity of these devices helps keep the devices functioning as they were intended to function. However, over time these parts may degrade due to their constant actuation. Also, with application of a heat to the MEMS device and its components, the parts may be more easily degraded.

Amorphous metals comprise robust chemical, mechanical, and thermal properties that may be used in a number of applications. Unlike most metals that are generally crystalline in structure, amorphous metals are non-crystalline such that they retain a high electrical conductivity while still being chemically, mechanically, and thermally robust.

Because of the high durability, for example, amorphous metals may be used in a number of environments. In one example, an amorphous metal may be used in environments that experience cavitation forces. One such example is in an inkjet printer. In one example, an inkjet printer comprises a chamber into which an amount of fluid is present. The chamber is connected to a nozzle bore and a nozzle orifice. During operation, the membrane may be actuated by, for example, a piezoelectric device causing the membrane to flex into the cavity. This in turn causes an amount of fluid to be shoved through the nozzle bore and out of the nozzle orifice. The membrane may be made of a metal comprising a crystalline form. The crystalline structure leads to grain boundaries and a relatively rough surface. Additionally, as heat is applied to these metals, the properties of the metals may change, causing degradation and destruction of the membrane and printhead over time.

Similarly, springs within certain MEMS devices may suffer from the same degradation. When these springs are made out of a metal, the crystalline structure leads to grain boundaries and a relatively rough surface. As these springs are actuated, the spring may begin to deteriorate over time. The cost of creating these MEMS devices may be relatively expensive.

Silicon oxide (SiO or $SiO_2$) may be one material used to construct MEMS membranes and springs. However, silicon oxide is very brittle material susceptible to the formation of microcracks during fabrication. As a result, this may lead to the ultimate failure of those devices using a membrane or spring fabricated exclusively from silicon oxide. Hafnium oxide ($HfO_2$) coatings have been added to silicon dioxide membranes to heal micro cracks created during use of the MEMS device. This led to an increase in the lifetime of the device. However hafnium oxide is still a very brittle material and does not have the elasticity sought for in an amorphous metal material.

The present specification, therefore describes an elastic device comprising an amorphous metal comprising at least one refractory metal, at least two elements selected from groups 4, 5, 6, 9, and 10 of the periodic table, and at least one metalloid. In one example, the amorphous metal is TaWiSi.

The present specification further describes a membrane comprising a layer of silicon dioxide and a layer of amorphous metal. In one example, the amorphous metal is TaWiSi.

The present specification further describes a MEMS device comprising a layer of amorphous metal comprising at least one refractory metal, at least two elements selected from groups 4, 5, 6, 9, and 10 of the periodic table, and a metalloid. In one example, the amorphous metal is TaWiSi.

As used in the present specification and in the appended claims, the term "elastic" is meant to be understood broadly as any solid material that returns to its original shape after being deformed. In one example, an elastic material is a membrane. In another example, the elastic material is a spring.

As used in the present specification and in the appended claims, the term "a number of" or similar language is meant to be understood broadly as any positive number comprising 1 to infinity; zero not being a number, but the absence of a number.

As used in the present specification and in the appended claims, a "refractory metal" is meant to be understood as Niobium, Molybdenum, Tantalum, Tungsten, Titanium, Rhenium, Vanadium, Chromium, Zirconium, Hafnium, Ruthenium, Rhodium, Osmium, and Iridium.

Additionally, as used in the present specification and in the appended claims, the term "a number of" or similar language is meant to be understood broadly as any positive number comprising 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with that example is included as described, but may not be included in other examples.

Turning now to the figures, FIG. 1 is a diagram of a fluid chamber (100) in a printhead according to one example of the principles described herein. The chamber (100) may comprise a nozzle bore (105), a nozzle orifice (110) and a number of walls (115). The walls (115) enclose chamber formed further by a membrane (120) opposite the nozzle orifice (110) and nozzle bore (105).

The membrane (120) may be made up of a number of layers. In one example, the layers comprise an amorphous metal layer (125) and a actuation layer (130). The amorphous metal layer (130) may come in contact with the fluid kept in the chamber (100). The amorphous layer (125) may have the actuation layer (130) coupled to the back side of the amorphous layer (125) and may provide support to the amorphous layer (125) structurally.

During operation, the membrane (120) may be caused to be deformed into the chamber (100) such that the fluid inside the chamber (100) is ejected out in droplets (135). In one example, the actuation layer (130) may be a piezoelectric material that deforms the amorphous metal layer (125). The deformation of the membrane (120) may occur any number of times and may be dependent on the number of times the nozzle orifice (110) is to fire. The deformation also places an amount of stress on the areas where the membrane (120) meets the walls (115) of the chamber (100). At these locations, the membrane has a relatively larger stress point as the membrane (120) is deformed. In one example, the amorphous metal layer (125) entirely comprises an amorphous layer (125). In another example, the amorphous metal layer (125) may comprise a $SiO_2$ layer with an amorphous metal layer (125) deposited thereon. In this example, the amorphous metal layer (125) is subjected to the fluid within the chamber, leaving the $SiO_2$ layer out of contact from the fluid. The amorphous metal layer (125) extends the lifetime of the membrane (120).

In one example, the amorphous metal comprises a refractory metal and a metalloid. In another example, the amorphous metal comprises two or three metallic elements from groups 4, 5, 6, 9, and 10 of the periodic table with the addition of Si as a metalloid component. In another example, a trace amount of oxygen is incorporated into the membrane or actuation layer. This may be done in order to stabilize the material while maintaining the properties of an amorphous metal. In other examples, the amorphous metal may comprise Ta, W, Ni, Pt, Mo, Si, O, or combinations thereof. In other examples, the amorphous metal may comprise Ta, W, Ni, Pt, Mo, Si, O, V, Nb, Ti, Zr, Hf, Cr, Co, Pd, Rh, Ir, or combinations thereof. In one example, the amorphous metal is TaWSi. In an example, the thickness of the coating may be 0.5 microns thick.

Figure 2A:
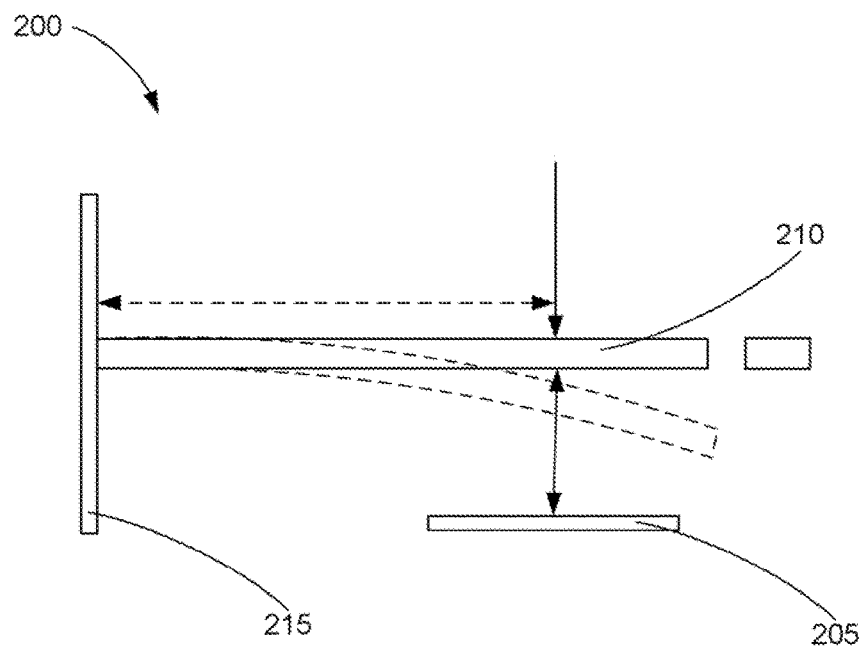
FIG. 2A is a diagram of a MEMS actuator according to one example of the principles described herein.

FIG. 2A is a diagram of a MEMS actuator (200) according to one example of the principles described herein. The actuator (200) may comprise a capacitor (205) and actuator arm (210) coupled to a platform (215). The actuator arm or beam (210) may deflect or bend towards the capacitor (215) upon application of a current in the capacitor and the fringe field created. As described above, the constant bending of the actuator arm (210) may begin to fatigue the actuator arm (210) over time causing eventual failure of the device. In one example, the actuator arm (210) may be made of the above described amorphous metal. In another example, the actuator arm (210) may be coated with the above described amorphous metal. Like the membrane above, the amorphous metal layer may extend the lifetime of the actuator arm (210).

Figure 2B:
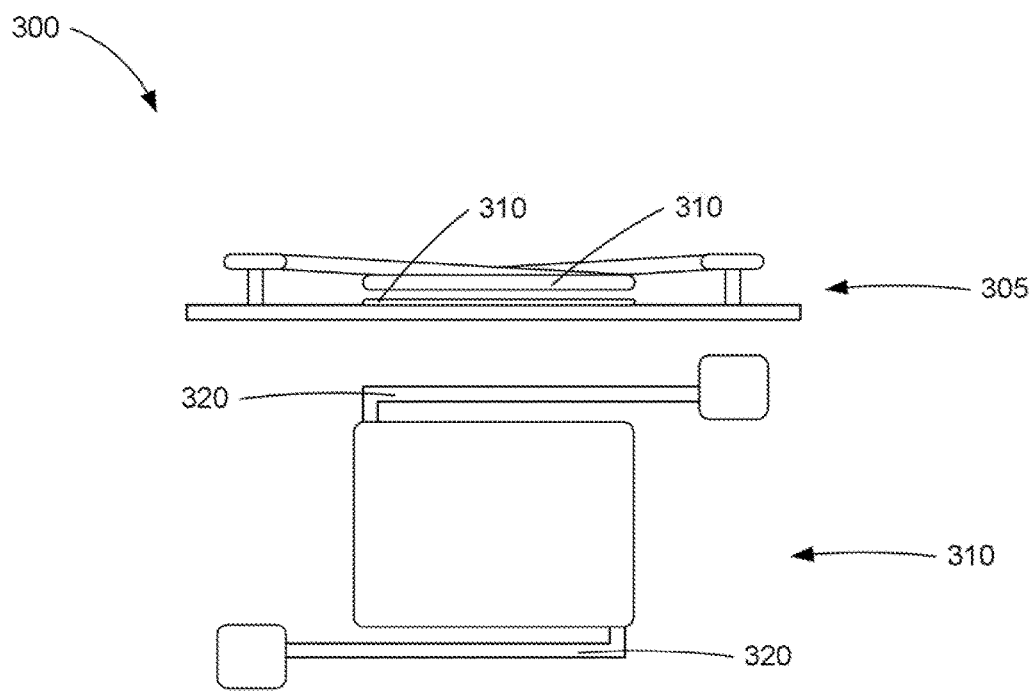
FIG. 2B is a side and top view of a symmetrical actuator (300) according to one example of the principles described herein.

FIG. 2B is another example of a MEMS device that the amorphous metal may extend the lifetime of. FIG. 2B is a side (305) and top view (310) of a symmetrical actuator (300) according to one example of the principles described herein. The symmetrical actuator (300) may comprise a number of capacitors (310) and a number of actuator arms (320). During operation, a current is applied to the capacitors (310) causing a force between the two capacitors (315). This causes the capacitors (310) to come together. The actuator arms (320) bend to allow this to happen. In one example, these actuator arms (320) are made of the amorphous metal as described above. In another example, the actuator arms (320) are coated with the amorphous metal as described above.

Figure 2C:
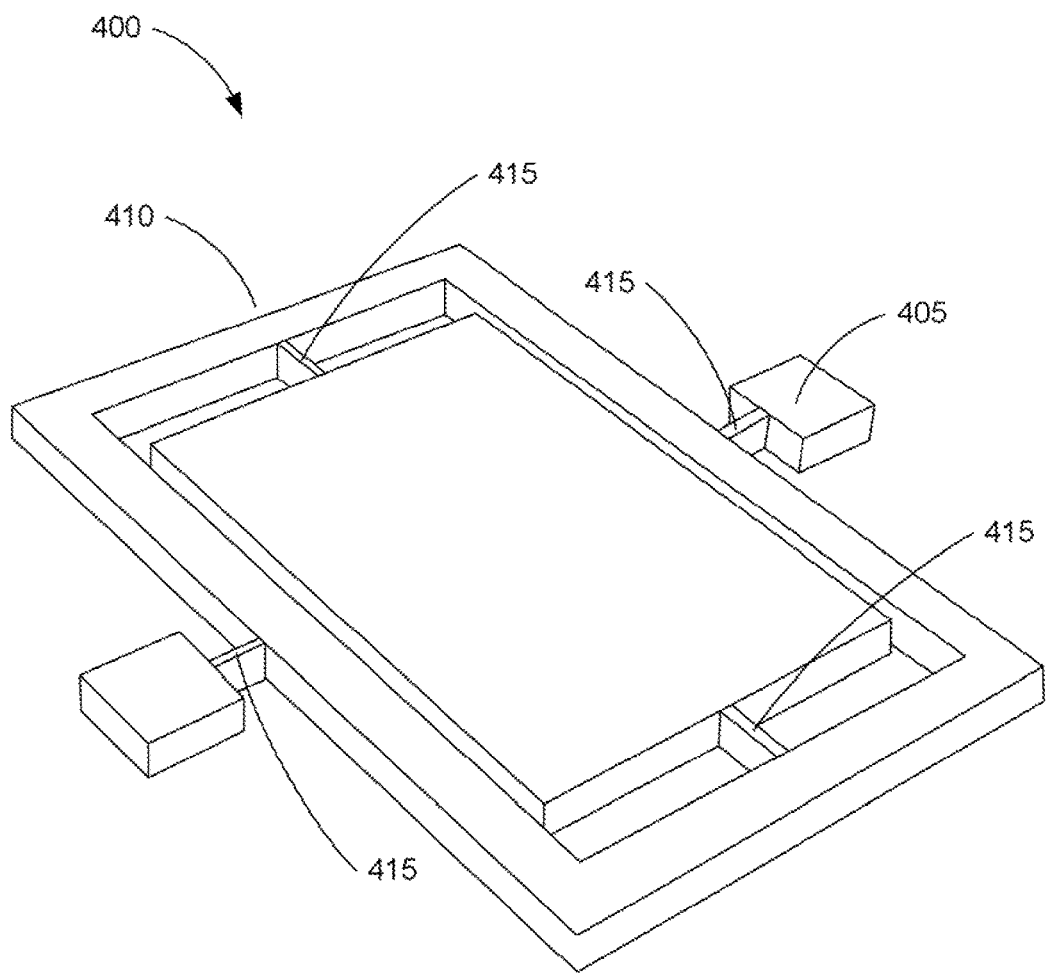
FIG. 2C is a perspective view of a torsional z-Axis gyroscope MEMS device according to one example of the principles described herein.

FIG. 2C is a perspective view of a torsional z-Axis gyroscope (400) MEMS device according to one example of the principles described herein. The gyroscope (400) may comprise a rotational drive oscillator (405), a sense mode angular accelerometer (410), and a number of gimbals (415). During an acceleration of the device, the gimbals (415) flex allowing the device to detect movement. Similar to above, the gimbals (415) may be made of the amorphous metal as described above. In another example, the gimbals (415) may be coated with the amorphous metal.

Although FIGS. 1-2C show a number of MEMS devices and in particular a membrane and springs that may be made of or coated with the amorphous metal described herein, these are meant to be examples. Consequently, the figures are not meant to limit the present specification to any particular MEMS devices or part of an MEMS devices. As such, the present amorphous metal may be used in other MEMS devices or MEMS device parts such as hinges without going beyond the principles described herein.

The use of the above described amorphous metal for MEMS has shown the advantage of being free of grain boundaries and having an atomically smooth interface. The highly stable amorphous structure improves the mechanical robustness of thin films in MEMS leading to excellent fatigue resistant properties. Additionally, the high degree of thermal and chemical stability of these amorphous metals also opens up opportunities for the creation of MEMS devices in high temperature or chemically aggressive applications.

The preceding description has been presented to illustrate and describe examples of the principles described. This description is not intended to be exhaustive or to limit these principles to any precise form disclosed. Many modifications and variations are possible in light of the above teaching.

What is claimed is:

1. An elastic device comprising:
    a deflectable element to bend in response to application of an electrical stimulus, the deflectable element comprising an amorphous metal comprising:
    a refractory metal;
    elements selected from, groups 4, 5, 6, 9, and 10 of the periodic table; and
    a metalloid.

2. The elastic device of claim 1, wherein the deflectable element comprises a membrane.

3. The elastic device of claim 2, wherein the membrane is incorporated into an inkjet fluid chamber.

4. The elastic device of claim 1, wherein the deflectable element comprises a spring.

5. The elastic device of claim 1, wherein the metalloid is Silicon.

6. The elastic device of claim 1, wherein the amorphous metal comprises Tantalum (Ta), Tungsten (W), and Silicon (Si).

7. The elastic device of claim 1, wherein the refractory metal comprises Niobium, Molybdenum, Tantalum, Tungsten, Rhenium, or a combination thereof.

8. The elastic device of claim 2, wherein the membrane comprises a layer of the amorphous metal, and a layer of piezoelectric material that is activatable to deform the layer of amorphous metal.

9. The elastic device of claim 8, wherein the membrane further comprises an oxide layer in contact with the layer of the amorphous metal.

10. A deflectable membrane comprising:
   a piezoelectric layer;
   a layer of silicon dioxide; and
   a layer of amorphous metal, the piezoelectric layer activatable to deform the layer of amorphous metal, the amorphous metal comprising:
      a refractory metal;
      elements selected from groups 4, 5, 6, 9, and 10 of the periodic table; and
      a metalloid.

11. The deflectable membrane of claim 10, wherein the amorphous metal comprises TaWSi.

12. A device comprising:
   a support; and
   a deflectable element attached to the support, the deflectable element to bend in response to application of an electrical stimulus, the deflectable element comprising a layer of amorphous metal comprising:
      a refractory metal;
      elements selected from, groups 4, 5, 6, 9, and 10 of the periodic table; and
      a metalloid.

13. The device of claim 12, wherein the amorphous metal comprises Tantalum (Ta), Tungsten (W), and Silicon (Si).

14. The device of claim 12, wherein the deflectable element comprises a spring.

15. The device of claim 12, wherein the metalloid is Silicon.

16. The device of claim 12, further comprising a chamber to receive a fluid, the layer of amorphous metal to deflect into the chamber and contact the fluid.

17. The device of claim 16, further comprising an orifice through which a fluid droplet is to pass from the chamber in response to deflection of the amorphous metal into the chamber.

18. The device of claim 16, wherein the deflectable element comprises a piezoelectric layer that upon activation deflects the layer of amorphous metal into the chamber.

19. The device of claim 12, further comprising a capacitor comprising a plate, wherein application of an electrical current to the capacitor is to cause deflection of the deflectable element towards the capacitor.

20. The device of claim 12, further comprising a capacitor comprising plates, wherein application of an electrical current to the capacitor is to cause the plates to come together and deflect the deflectable element.

* * * * *